(12) United States Patent
Snoeij et al.

(10) Patent No.: US 11,502,655 B2
(45) Date of Patent: Nov. 15, 2022

(54) LOGARITHMIC AMPLIFIER CIRCUIT

(71) Applicant: TEXAS INSTRUMENTS INCORPORATED, Dallas, TX (US)

(72) Inventors: Martijn Fridus Snoeij, Erding (DE); Marco Corsi, Scotts Valley, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 104 days.

(21) Appl. No.: 16/937,746

(22) Filed: Jul. 24, 2020

(65) Prior Publication Data

US 2021/0067112 A1    Mar. 4, 2021

Related U.S. Application Data

(60) Provisional application No. 62/893,312, filed on Aug. 29, 2019.

(51) Int. Cl.
*H03F 3/45* (2006.01)

(52) U.S. Cl.
CPC ........... *H03F 3/45085* (2013.01); *H03F 2203/45021* (2013.01); *H03F 2203/45022* (2013.01)

(58) Field of Classification Search
CPC ....... H03F 3/45085; H03F 2203/45021; H03F 2203/45022; H03F 3/087; H03F 3/195; H03F 2203/30111; H03F 2203/45654; H03F 3/3069; H03F 3/45475; H03F 3/45183; H03F 3/45179; H03F 3/45192; H03F 3/45; H03G 3/3084; H03G 7/001; H03G 1/0023; H03G 1/0088

USPC .......................... 330/252–255, 262–265, 300
See application file for complete search history.

(56) References Cited

U.S. PATENT DOCUMENTS

| | | | | |
|---|---|---|---|---|
| 3,506,847 A * | 4/1970 | Schow | ..................... | G06G 7/24 327/350 |
| 3,573,491 A * | 4/1971 | Goss | ..................... | H03F 3/1935 330/95 |
| 4,232,233 A * | 11/1980 | Clouser | ..................... | G06G 7/24 327/350 |
| 4,891,603 A * | 1/1990 | Oda | ..................... | G06G 7/24 330/110 |
| 5,004,906 A * | 4/1991 | Takasaki | ..................... | H03G 7/00 250/584 |
| 5,138,280 A * | 8/1992 | Gingrich | ..................... | H03G 1/007 330/84 |
| 5,699,004 A * | 12/1997 | Picciotto | ..................... | H03G 7/06 327/350 |

(Continued)

OTHER PUBLICATIONS

Analog Devices. "High Speed, 200 dB Range, Logarithmic Converter." Data Sheet ADL5304, 2011-2016, pp. 1-32.

*Primary Examiner* — Khanh V Nguyen
(74) *Attorney, Agent, or Firm* — Michelle F. Murray; Charles A. Brill; Frank D. Cimino

(57) ABSTRACT

A logarithmic amplifier circuit includes an adaptive gain amplifier circuit and a transistor. The adaptive gain amplifier circuit includes a gain stage and a diode. The gain stage includes an input terminal, and an output terminal. The diode includes a cathode terminal coupled to the output terminal, and an anode terminal coupled to a common terminal. The transistor includes a first terminal coupled to the input terminal, a second terminal coupled to the common terminal, and a third terminal coupled to the output terminal.

20 Claims, 4 Drawing Sheets

(56) References Cited

U.S. PATENT DOCUMENTS 5,939,944 A * 8/1999 Gibson ................ H03F 3/3088
330/300
6,922,105 B2 * 7/2005 Imai ..................... H03F 3/3071
330/264

* cited by examiner

LOGARITHMIC AMPLIFIER CIRCUIT

CROSS-REFERENCE TO RELATED APPLICATION

This application claim priority to U.S. Provisional Application No. 62/893,312, filed Aug. 29, 2019, entitled "High-Speed Logarithmic Amplified with Adaptive Loop Gain," which is hereby incorporated herein by reference in its entirety.

BACKGROUND

A logarithmic amplifier is an electronic circuit that generates an output signal having a magnitude that is proportional to a logarithm of the input signal magnitude. Logarithmic amplifiers are used in many applications where signals of large dynamic range may be encountered to compress wide dynamic range input signals. Outputs of photodiodes, ultrasonic receivers, and radar receivers are example of signals that are sometimes compressed using a logarithmic amplifier.

SUMMARY

A logarithmic amplifier circuit that includes an adaptive gain amplifier to provide high-speed and stability are disclosed herein. In one example, a logarithmic amplifier circuit includes an adaptive gain amplifier circuit and a transistor. The adaptive gain amplifier circuit includes a gain stage and a diode. The gain stage includes an input terminal, and an output terminal. The diode includes a cathode terminal coupled to the output terminal, and an anode terminal coupled to a common terminal. The transistor includes a first terminal coupled to the input terminal, a second terminal coupled to the common terminal, and a third terminal coupled to the output terminal.

In another example, a logarithmic amplifier circuit includes a current input terminal, an adaptive gain amplifier circuit, and a transistor. The adaptive gain amplifier circuit is configured to provide a gain that decreases with increase of to an input current received at the current input terminal, and includes a non-inverting input terminal, and an output terminal. The transistor includes a first terminal coupled to the output terminal of the adaptive gain amplifier, a second terminal coupled to the non-inverting input terminal of the adaptive gain amplifier, a third terminal coupled to a common terminal.

In a further example, a logarithmic amplifier circuit includes an output terminal, an adaptive gain amplifier circuit, and a transistor. The adaptive gain amplifier circuit includes a gain stage, a first diode, a second diode, and voltage source. The gain stage includes an input terminal and an output terminal. The first diode includes a cathode terminal coupled to the output terminal of the gain stage, and an anode terminal. The second diode includes a cathode terminal coupled to the anode terminal of the first diode, and an anode terminal. The voltage source includes a first terminal coupled to the anode terminal of the second diode, and a second terminal coupled to a common terminal. The transistor includes a first terminal coupled to the input terminal of the gain stage, a second terminal coupled to the common terminal, and a third terminal coupled to the output terminal of the logarithmic amplifier circuit.

BRIEF DESCRIPTION OF THE DRAWINGS

For a detailed description of various examples, reference will now be made to the accompanying drawings in which.

DETAILED DESCRIPTION

Figure 1:
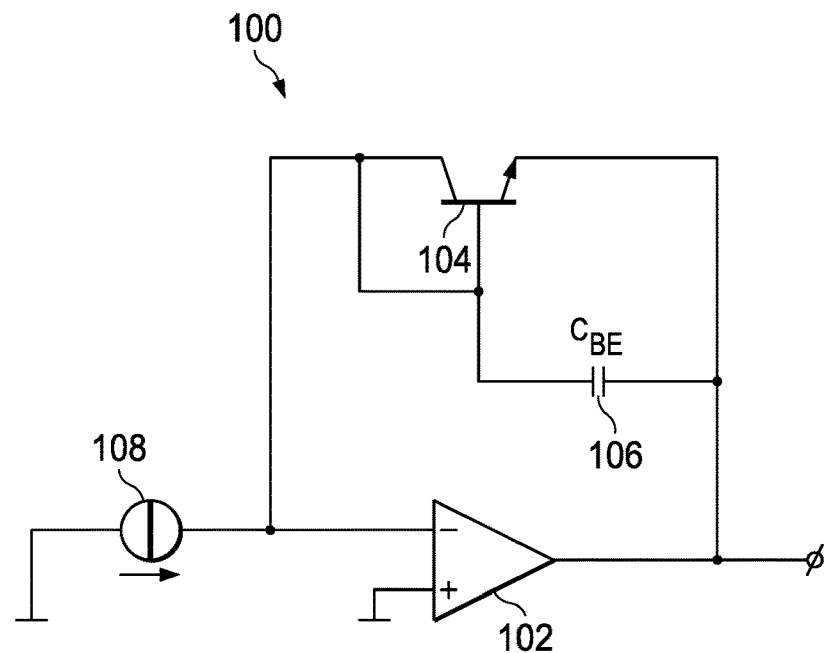
FIG. 1 shows a schematic diagram for an example logarithmic amplifier circuit that includes a diode-connected transistor.

FIG. 1 shows a schematic diagram for an example logarithmic amplifier circuit 100. The logarithmic amplifier circuit 100 includes an operational amplifier 102 and a diode-connected transistor 104. The diode-connected transistor 104 is connected in the feedback path of the operational amplifier 102, between the output and the inverting input of the operational amplifier 102. The base terminal and the collector terminal of the diode-connected transistor 104 are coupled to the inverting input of the operational amplifier 102, and the emitter terminal of the diode-connected transistor 104 is coupled to the output of the operational amplifier 102. The base-emitter capacitance 106 of the diode-connected transistor 104 is charged by input current, generated by the current source 108, flowing at the inverting input terminal of the operational amplifier 102. When the input current is low (e.g., <100 nanoamperes (nA)), the response of the logarithmic amplifier circuit 100 is slow due to the time needed to charge the base-emitter capacitance 106.

Figure 2:
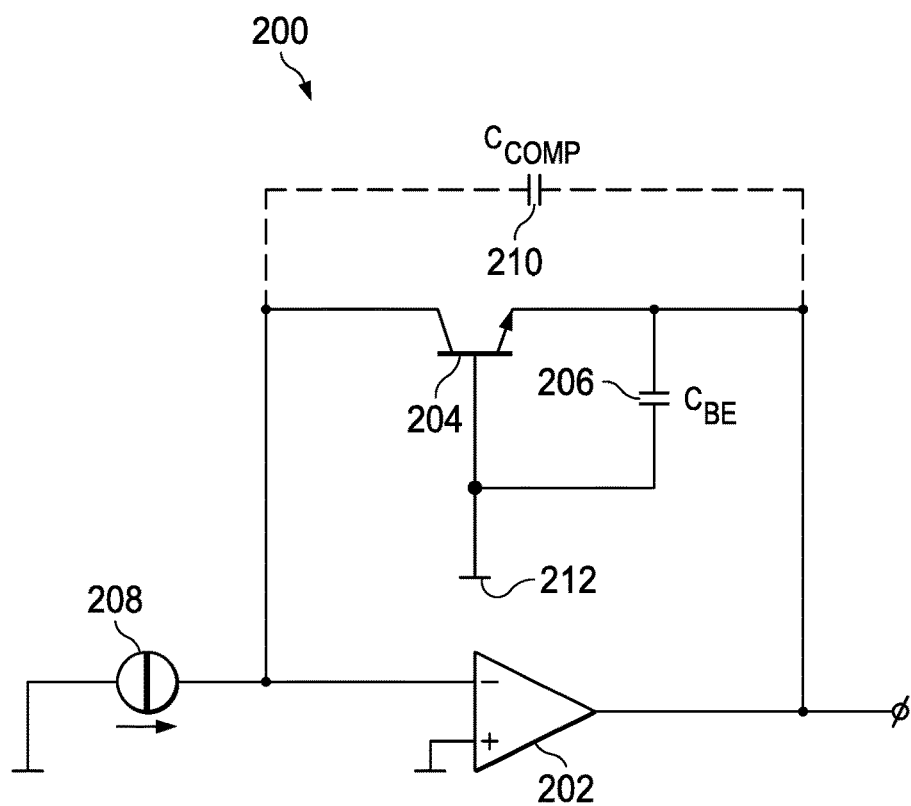
FIG. 2 shows a schematic diagram for an example logarithmic amplifier circuit that includes a common-base connected transistor.

FIG. 2 shows a schematic diagram for an example logarithmic amplifier circuit 200. The logarithmic amplifier circuit 200 includes an operational amplifier 202 and a transistor 204. The transistor 204 is connected in a common-base configuration, in which the base terminal of the transistor 204 is coupled to a common voltage source 212. The transistor 204 is connected in the feedback path of the operational amplifier 202, between the output and the inverting input of the operational amplifier 202. The collector terminal of the transistor 204 is coupled to the inverting input of the operational amplifier 202, and the emitter terminal of the transistor 204 is coupled to the output of the operational amplifier 202. The base-emitter capacitance 206 of the transistor 204 is not charged via the input current generated by the 208, which should increase the speed of the logarithmic amplifier circuit 200 relative to the logarithmic amplifier circuit 100. However, the logarithmic amplifier circuit 200 is difficult to stabilize, and a compensation capacitor 210 is added between the output and the inverting input of the operational amplifier 202 to stabilize the operational amplifier 202. The input current generated by the 208 charges the compensation capacitor 210, which reduces the response speed of the operational amplifier 202, and makes the response speed of the logarithmic amplifier circuit 200 similar to that of the logarithmic amplifier circuit 100.

In a practical example, input current to a logarithmic amplifier circuit ranges from 100 picoamperes to 10 milliamperes. To provide reasonable response speed with low input currents, detailed analysis of the logarithmic amplifier circuit 200 shows that the gain of the operational amplifier 202 should be greater than 1000. With high input currents, the bandwidth of the operational amplifier 202 should be greater than 500 megahertz to ensure stability. However, a gain-bandwidth product of 500 gigahertz (GHz) (gain of 1000 and 500 MHz bandwidth) is not feasible with reasonable power consumption.

The logarithmic amplifier circuits disclosed herein include an adaptive gain amplifier. The gain of the adaptive gain amplifier decreases as input current increases. For example, the adaptive gain amplifier provides a gain of greater than 1000 with an input current of 10 nA and bandwidth of about 5 megahertz (MHz), and provides a gain of 10 or less with an input current greater than 1 milliampere (ma) and bandwidth of greater than 500 MHz. Thus, the logarithmic amplifier circuits provide sufficient gain with low input currents to enable fast response, and provide sufficient bandwidth with high input currents to ensure stability.

Figure 3:
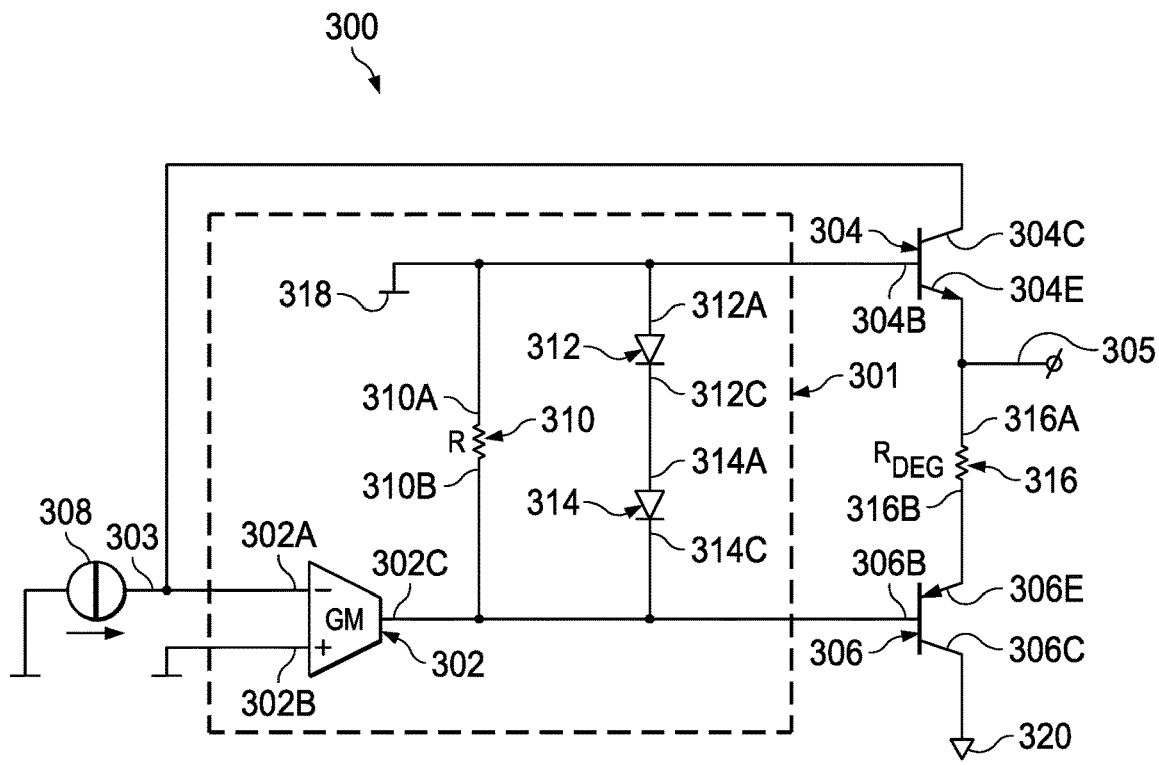
FIG. 3 shows a schematic diagram for an example logarithmic amplifier circuit that includes an adaptive gain amplifier.

FIG. 3 shows a schematic diagram for an example logarithmic amplifier circuit 300 with adaptive gain. The logarithmic amplifier circuit 300 includes an adaptive gain amplifier circuit 301, a current input terminal 303, an output terminal 305, a transistor 304, a transistor 306, and a resistor 316. The adaptive gain amplifier circuit 301 provides a gain that decreases with increase of the input current generated by the current source 308 (e.g., a photodiode) and received at the current input terminal 303. The adaptive gain amplifier circuit 301 is coupled to the current input terminal 303, the transistor 304, and the transistor 306. The adaptive gain amplifier circuit 301 includes a gain stage 302, a resistor 310, a diode 312, and a diode 314. The gain stage 302 is an operational transconductance amplifier in some implementations of the adaptive gain amplifier circuit 301. The gain stage 302 includes an inverting input terminal 302A, a non-inverting input terminal 302B, and an output terminal 302C. The inverting input terminal 302A is coupled to the current input terminal 303. The non-inverting input terminal 302B is coupled to a common terminal 318. The resistor 310 is coupled to the output terminal 302C and the common terminal 318. The resistor 310 includes a terminal 310A coupled to the common terminal 318, and a terminal 310B coupled to the output terminal 302C. The diode 312 and the diode 314 are coupled in series between the output terminal 302C and the common terminal 318. The diode 312 includes an anode terminal 312A coupled to the common terminal 318 and a cathode terminal 312C coupled to an anode terminal 314A of the diode 314. The cathode terminal 314C of the diode 314 is coupled to the output terminal 302C of the gain stage 302.

The transistor 304 is coupled to the inverting input terminal 302A and the output terminal 305. The transistor 304 is in common-base configuration. The transistor 304 is an NPN bipolar junction transistor (BJT) in some implementations of the logarithmic amplifier circuit 300. A collector terminal 304C of the transistor 304 is coupled to the inverting input terminal 302A of the gain stage 302. A base terminal 304B of the transistor 304 is coupled to the common terminal 318. An emitter terminal 304E of the transistor 304 is coupled to the output terminal 305.

The transistor 306 is coupled to the gain stage 302 and the output terminal 305. The transistor 306 is a PNP BJT in some implementations of the logarithmic amplifier circuit 300. A collector terminal 306C of the transistor 306 is coupled to a ground terminal 320. A base terminal 306B of the transistor 306 is coupled to the output terminal 302C. An emitter terminal 306E of the transistor 306 is coupled to the output terminal 305 via the resistor 316. The resistor 316 includes a terminal 316A coupled to the output terminal 305 and a terminal 316B coupled to the 306E of the transistor 306.

Figure 4:
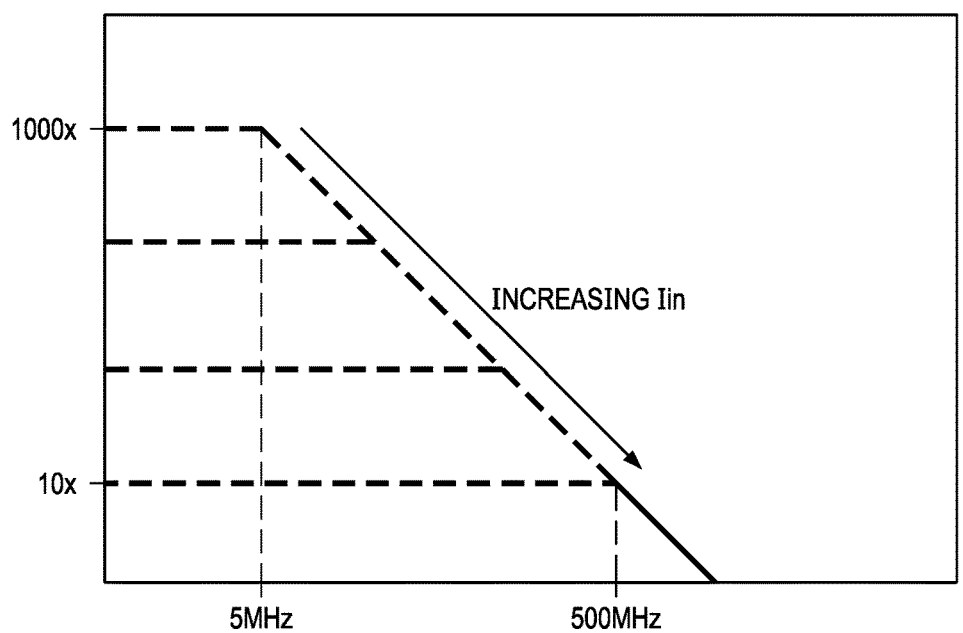
FIG. 4 shows an example graph of gain versus frequency in a logarithmic amplifier circuit that includes an adaptive gain amplifier.

FIG. 4 shows an example graph of gain versus frequency in the logarithmic amplifier circuit 300. As input current increases, gain of the adaptive gain amplifier circuit 301 decreases. Similarly, the bandwidth of the adaptive gain amplifier circuit 301 increases as the input current increases. With input current less than 10 nA, the diode 312 and the diode 314 are off, and the gain of the adaptive gain amplifier circuit 301 is:

$$gm*R,$$

where:
gm is the gain of the gain stage 302; and
R is the resistance of the resistor 310.

With input current greater than 10 nA, the diode 312 and the diode 314 are on, and gain of the adaptive gain amplifier circuit 301 is:

$$gm*2*Rdiode,$$

where Rdiode is the small signal impedance of the diodes 312 and 314. The impedance Rdiode depends on the voltage drop across the diodes 312 and 314, which in turn is linked to the voltage drop across that base-emitter junction 304B-304E, the resistor 316 and the emitter-base junction 306E-306B, which depends on input current. Therefore, the gain of the adaptive gain amplifier circuit 301 decreases with increasing input current.

Figure 5:
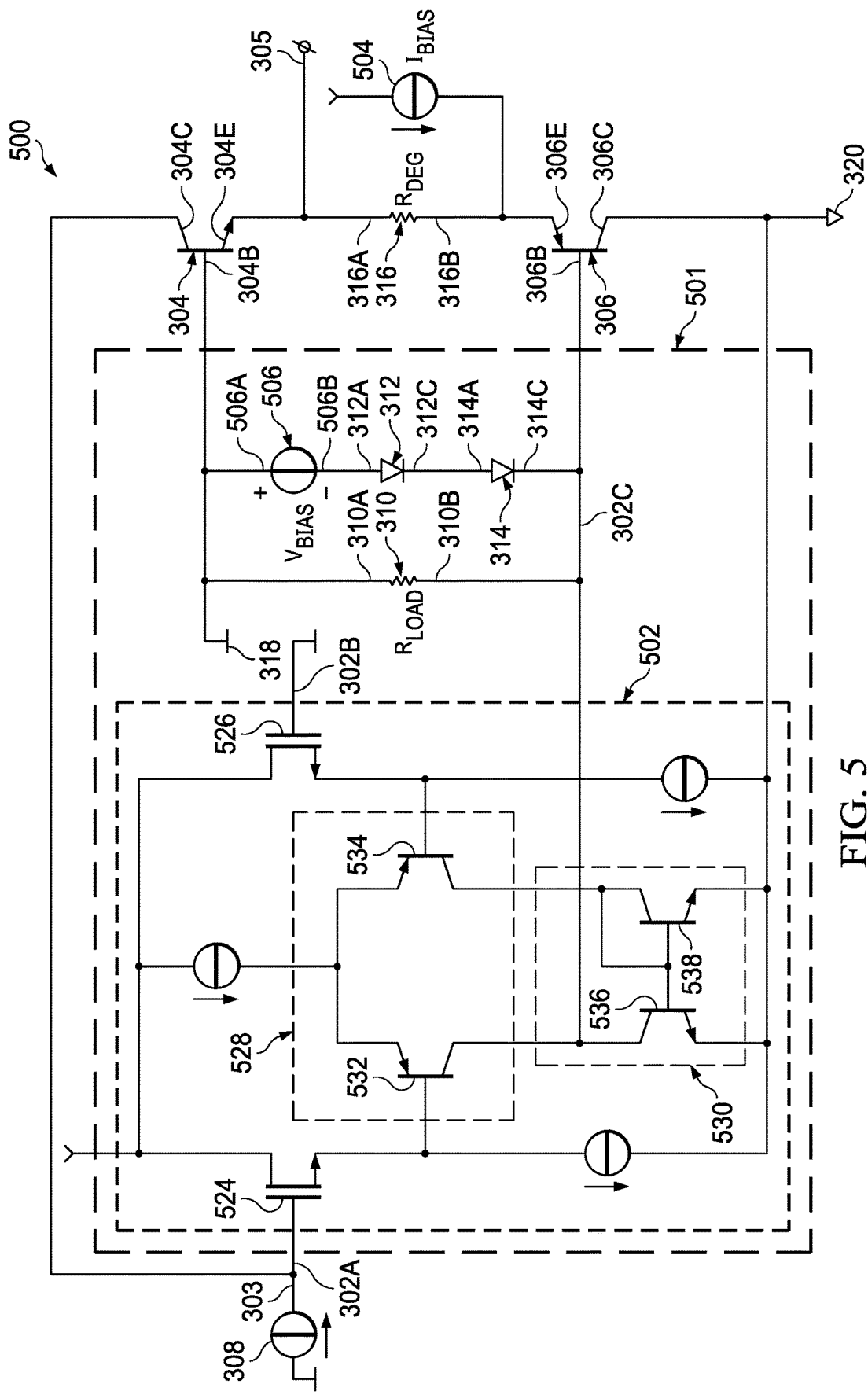
FIG. 5 shows a schematic diagram for an example logarithmic amplifier circuit that includes an adaptive gain amplifier.

FIG. 5 shows a schematic diagram for an example logarithmic amplifier circuit 500 with adaptive gain. The logarithmic amplifier circuit 500 is an implementation of the logarithmic amplifier circuit 300. The logarithmic amplifier circuit 500 includes an adaptive gain amplifier circuit 501, the current input terminal 303, the output terminal 305, the transistor 304, the transistor 306, the resistor 316, and a bias current source 504. The adaptive gain amplifier circuit 501 provides a gain that decreases with increase of the input current generated by the current source 308 and received at the current input terminal 303. The adaptive gain amplifier circuit 501 is coupled to the current input terminal 303, the transistor 304, and the transistor 306. The adaptive gain amplifier circuit 501 includes a gain stage 502, the resistor 310, the diode 312, the diode 314, and a voltage source 506.

The gain stage 502 includes an input transistor 524, an input transistor 526, a differential amplifier circuit 528, and a current mirror circuit 530. The input transistor 524 and the input transistor 526 are N-channel metal oxide semiconductor field effect transistors (MOSFETs) in some implementations of the gain stage 502. The gate terminal of the input transistor 524 is coupled to the inverting input terminal 302A for reception of input signal, and the gate terminal of the input transistor 526 is coupled to the non-inverting input terminal 302B. The differential amplifier circuit 528 includes transistor 532 and transistor 534. The transistor 532 and the transistor 534 are PNP BJTs in some implementations of the gain stage 502. The base terminal of the transistor 532 is coupled to the source terminal of the input transistor 524, and the base terminal of the transistor 534 is coupled to the source terminal of the input transistor 526.

The current mirror circuit 530 is coupled to the differential amplifier circuit 528. The current mirror circuit 530 includes a diode-connected transistor 536 and a transistor 538. The diode-connected transistor 536 and the transistor 538 are NPN BJTs in some implementations of the gain stage 502. The collector terminal of the diode-connected transistor 536 is coupled to the collector terminal of the transistor 532 and the collector terminal of the transistor 538 is coupled to the collector terminal of the transistor 534.

The resistor 310 is coupled to the output terminal 302C and the common terminal 318. The resistor 310 includes a terminal 310A coupled to the common terminal 318 and a terminal 310B coupled to the output terminal 302C. The voltage source 506 includes a terminal 506A coupled to the common terminal 318, and a terminal 506B coupled to the anode terminal 312A of the diode 312. The voltage source 506 generates a bias voltage that allows the tuning of gain versus input current in the adaptive gain amplifier circuit 501. The diode 312 and the diode 314 are coupled in series between the output terminal 302C and the voltage source 506. The diode 312 includes an anode terminal 312A of the diode 312 is coupled to terminal 506B of the voltage source 506, and the cathode terminal 312C of the diode 312 is coupled to the anode terminal 314A of the diode 314. The cathode terminal 314C of the diode 314 is coupled to the output terminal 302C of the gain stage 502.

The transistor 304 is coupled to the inverting input terminal 302A and the output terminal 305. The transistor 304 is in common-base configuration. The transistor 304 is an NPN BJT in some implementations of the logarithmic amplifier circuit 500. A collector terminal 304C of the transistor 304 is coupled to the inverting input terminal 302A of the gain stage 502. A base terminal 304B of the transistor 304 is coupled to the common voltage source via a common terminal 318. An emitter terminal 304E of the transistor 304 is coupled to the output terminal 305.

The transistor 306 is coupled to the gain stage 502 and the output terminal 305. The transistor 306 is a PNP BJT in some implementations of the logarithmic amplifier circuit 500. A collector terminal 306C is coupled to the ground terminal 320. A base terminal 306B of the transistor 306 is coupled to the output terminal 302C. An emitter terminal 306E of the transistor 306 is coupled to the transistor 304 via the resistor 316. The resistor 316 includes a terminal 316A coupled to the output terminal 305, and a terminal 316B coupled to the 306E of the transistor 306. The bias current source 504 provides a bias current to the transistor 306. The bias current source 504 is coupled to the emitter terminal 306E of the transistor 306.

Figure 6:
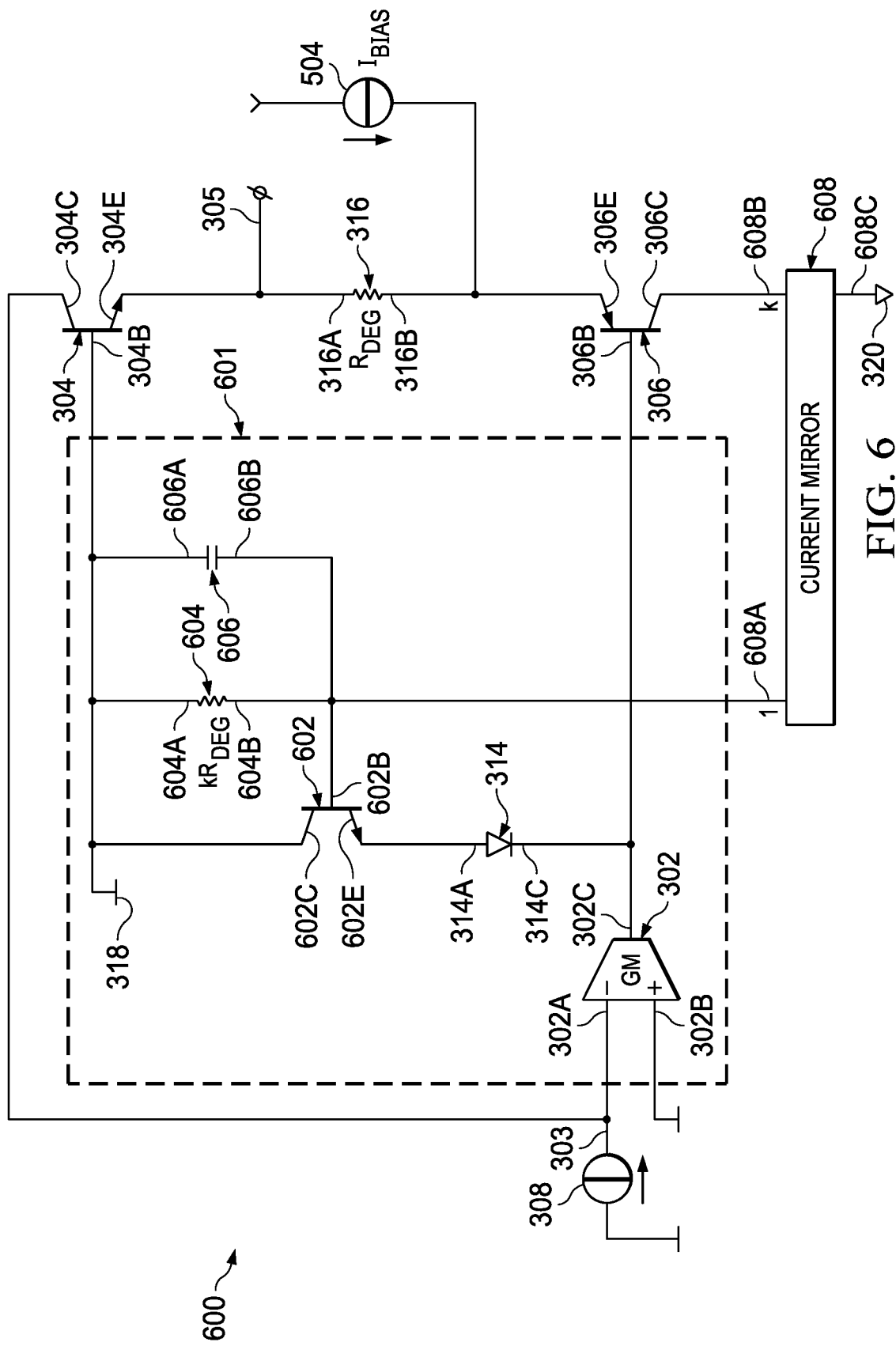
FIG. 6 shows a schematic diagram for an example logarithmic amplifier circuit that includes an adaptive gain amplifier and operates with higher input currents.

FIG. 6 shows a schematic diagram for an example logarithmic amplifier circuit 600 that includes an adaptive gain amplifier and operates with higher input currents. In the logarithmic amplifier circuit 300 and the logarithmic amplifier circuit 500, input current is limited by the current delivery capability of the gain stage 302 and the gain stage 502. For example, if the resistor 316 has resistance of 50 ohms, the voltage dropped across the resistor 316 is 500 my at 10 ma of input current. 500 mv is also dropped across the diodes 312 and 314, which causes excessive current that the gain stage 302 and gain stage 502 cannot deliver. The logarithmic amplifier circuit 600 operates without excessive current in the gain setting diodes of the adaptive gain amplifier.

The logarithmic amplifier circuit 600 includes an adaptive gain amplifier circuit 601, a current input terminal 303, an output terminal 305, a transistor 304, a transistor 306, a resistor 316, and current mirror circuit 608. The adaptive gain amplifier circuit 601 provides a gain that decreases with increase of the input current generated by the current source 308 (e.g., a photodiode) and received at the current input terminal 303. The adaptive gain amplifier circuit 601 is coupled to the current input terminal 303, the transistor 304, the transistor 306, and the current mirror circuit 608. The adaptive gain amplifier circuit 601 includes the gain stage 302, a diode 314, a transistor 602, a resistor 604, and a capacitor 606. The gain stage 302 includes an inverting input terminal 302A, a non-inverting input terminal 302B, and an output terminal 302C. The inverting input terminal 302A is coupled to the current input terminal 303. The non-inverting input terminal 302B is coupled to the common terminal 318.

The resistor 604 is coupled to the common terminal 318, and to the ground terminal 320 via the current mirror circuit 608. The resistor 604 includes a terminal 604A coupled to the common terminal 318, and a terminal 604B coupled to a terminal 608A of the current mirror circuit 608. Terminal 608C of the current mirror circuit 608 is coupled to the ground terminal 320.

The capacitor 606 is connected in parallel with the resistor 604. A terminal 606A of the capacitor 606 is coupled to the common terminal 318, and a terminal 606B of the capacitor 606 is coupled to the terminal 608A of the current mirror circuit 608. The capacitor 606 ensures the biasing loop formed by the resistor 604 and the current mirror circuit 608 is active only at low frequencies to ensure the biasing loop does not change the gain of adaptive gain amplifier circuit 601 at high frequencies.

The diode 314 and the transistor 602 are coupled in series between the output terminal 302C of the gain stage 302 and the common terminal 318. The diode 314 includes a cathode terminal 314C coupled to the output terminal 302C of the gain stage 302, and an anode terminal coupled to the emitter terminal 602E of the transistor 602. A collector terminal 602C of the transistor 602 is coupled to the common terminal 318. A base terminal 602B of the transistor 602 is coupled to the terminal 608A of the current mirror circuit 608 and to the common terminal 318 via the resistor 604 and the capacitor 606. The transistor 602 is an NPN BJT in some implementations of the adaptive gain amplifier circuit 601.

The transistor 304 is coupled to the inverting input terminal 302A and the output terminal 305. The transistor 304 is in common-base configuration. The transistor 304 is an NPN BJT in some implementations of the logarithmic amplifier circuit 600. A collector terminal 304C of the transistor 304 is coupled to the inverting input terminal 302A of the gain stage 302. A base terminal 304B of the transistor 304 is coupled to the common terminal 318. An emitter terminal 304E of the transistor 304 is coupled to the output terminal 305.

The transistor 306 is coupled to the gain stage 302 and the output terminal 305. The transistor 306 is a PNP BJT in some implementations of the logarithmic amplifier circuit 600. A collector terminal 306C of the transistor 306 is coupled to a terminal 608B of the current mirror circuit 608. A base terminal 306B of the transistor 306 is coupled to the output terminal 302C. An emitter terminal 306E of the transistor 306 is coupled to the output terminal 305 via the resistor 316. Current flow from the collector terminal 306C into the terminal 608B is K time greater than the current flow into the terminal 608A of the current mirror circuit 608 is some implementations of the logarithmic amplifier circuit 600. The resistor 316 includes a terminal 316A coupled to the output terminal 305 and a terminal 316B coupled to the 306E of the transistor 306. The resistance of the resistor 316 is a fraction (1/k) of the resistance of the resistor 604.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A logarithmic amplifier circuit, comprising:
   an adaptive gain amplifier circuit comprising:
      a gain stage comprising:
         an input terminal; and
         an output terminal; and
      a diode comprising:
         a cathode terminal coupled to the output terminal; and
         an anode terminal coupled to a common terminal; and
      a transistor comprising:
         a first terminal coupled to the input terminal;
         a second terminal coupled to the common terminal; and
         a third terminal coupled to the output terminal.

2. The logarithmic amplifier circuit of claim 1, wherein the adaptive gain amplifier circuit further comprises:
   a voltage source comprising:
      a first terminal coupled to the common terminal; and
      a second terminal coupled to the anode terminal of the diode.

3. The logarithmic amplifier circuit of claim 1, wherein:
   the diode is a first diode; and
   the adaptive gain amplifier circuit further comprises:
      a second diode comprising:
         a cathode terminal coupled to the anode terminal of the first diode; and
         an anode terminal coupled to the common terminal.

4. The logarithmic amplifier circuit of claim 1, wherein the adaptive gain amplifier circuit further comprises:
   a resistor comprising:
      a first terminal coupled to the output terminal; and
      a second terminal coupled to the common terminal.

5. The logarithmic amplifier circuit of claim 1, wherein:
   the transistor is a first transistor; and
   the logarithmic amplifier circuit further comprises:
      a second transistor comprising:
         a first terminal coupled to third terminal of the first transistor;
         a second terminal coupled to the output terminal of the gain stage; and
         a third terminal coupled to a ground terminal.

6. The logarithmic amplifier circuit of claim 5, further comprising:
   a resistor comprising:
      a first terminal coupled to the third terminal of the first transistor; and
      a second terminal coupled to the first terminal of the second transistor.

7. The logarithmic amplifier circuit of claim 5, further comprising:
   a third transistor comprising:
      a first terminal coupled to the anode terminal of the diode;
      a second terminal coupled to the common terminal; and
      a third terminal coupled to the common terminal;
   a resistor comprising:
      a first terminal coupled to the third terminal of the third transistor; and
      a second terminal coupled to the common terminal;
   a capacitor comprising:
      a first terminal coupled to the third terminal of the third transistor; and
      a second terminal coupled to the common terminal.

8. The logarithmic amplifier circuit of claim 7, further comprising a current mirror circuit comprising:
   a first terminal coupled to the ground terminal;
   a second terminal coupled to the first terminal of the resistor; and
   a third terminal coupled to the third terminal of the second transistor.

9. A logarithmic amplifier circuit, comprising:
   a current input terminal;
   an adaptive gain amplifier circuit configured to provide a gain that decreases as an input current received at the current input terminal increases, and comprising:
      an inverting input terminal; and
      an output terminal; and
   a transistor comprising:
      a first terminal coupled to the output terminal of the adaptive gain amplifier circuit;
      a second terminal coupled to the inverting input terminal of the adaptive gain amplifier circuit; and
      a third terminal coupled to a common terminal;
   wherein the adaptive gain amplifier circuit further comprises:
   a diode coupled to the output terminal of the adaptive gain amplifier circuit and the third terminal of the transistor, and configured to vary the gain of the adaptive gain amplifier circuit based on the input current.

10. The logarithmic amplifier circuit of claim 9, wherein:
    the diode is a first diode; and
    the adaptive gain amplifier circuit further comprises:
       a second diode coupled to the output terminal of the adaptive gain amplifier circuit and the third terminal of the transistor, and in series with the first diode.

11. The logarithmic amplifier circuit of claim 9, wherein the adaptive gain amplifier circuit further comprises:
    a voltage source coupled to the output terminal of the adaptive gain amplifier circuit and the third terminal of the transistor, and in series with the diode.

12. A logarithmic amplifier circuit, comprising:
    a current input terminal;
    an adaptive gain amplifier circuit configured to provide a gain that decreases as an input current received at the current input terminal increases, and comprising:
       an inverting input terminal; and
       an output terminal; and
    a transistor comprising:
       a first terminal coupled to the output terminal of the adaptive gain amplifier circuit;
       a second terminal coupled to the inverting input terminal of the adaptive gain amplifier circuit; and
       a third terminal coupled to a common terminal;
    wherein the adaptive gain amplifier circuit further comprises:
    a resistor coupled to the output terminal of the adaptive gain amplifier circuit and the third terminal of the transistor.

13. A logarithmic amplifier circuit, comprising:
    a current input terminal;

an adaptive gain amplifier circuit configured to provide a gain that decreases as an input current received at the current input terminal increases, and comprising:
an inverting input terminal; and
an output terminal; and
a transistor comprising:
a first terminal coupled to the output terminal of the adaptive gain amplifier circuit;
a second terminal coupled to the inverting input terminal of the adaptive gain amplifier circuit; and
a third terminal coupled to a common terminal;
wherein:
the transistor is a first transistor; and
the logarithmic amplifier circuit further comprises:
a second transistor comprising:
a first terminal coupled to the first terminal of the first transistor;
a second terminal coupled to the output terminal of the adaptive gain amplifier circuit; and
a third terminal coupled to a ground terminal.

14. The logarithmic amplifier circuit of claim 13, further comprising:
a resistor comprising:
a first terminal coupled to the first terminal of the first transistor; and
a second terminal coupled to the first terminal of the second transistor.

15. The logarithmic amplifier circuit of claim 13, wherein the adaptive gain amplifier circuit further comprises:
a diode coupled to the output terminal of the adaptive gain amplifier circuit and the third terminal of the first transistor, and configured to vary the gain of the adaptive gain amplifier circuit based on the input current;
a third transistor comprising:
a first terminal coupled to an anode terminal of the diode
a second terminal coupled to the common terminal; and
a third terminal coupled to the common terminal;
a resistor comprising:
a first terminal coupled to third terminal of the third transistor; and
a second terminal coupled to the common terminal;
a capacitor comprising:
a first terminal coupled to the third terminal of the third transistor; and
a second terminal coupled to the common terminal.

16. The logarithmic amplifier circuit of claim 15, further comprising a current mirror circuit comprising:
a first terminal coupled to a ground terminal;
a second terminal coupled to the first terminal of the resistor; and
a third terminal coupled to the third terminal of the second transistor.

17. A logarithmic amplifier circuit, comprising:
an output terminal;
an adaptive gain amplifier circuit comprising:
a gain stage comprising:
an input terminal; and
an output terminal; and
a first diode comprising:
a cathode terminal coupled to the output terminal of the gain stage; and
an anode terminal;
a second diode comprising:
a cathode terminal coupled to the anode terminal of the first diode; and
an anode terminal; and
a voltage source comprising:
a first terminal coupled to the anode terminal of the second diode; and
a second terminal coupled to a common terminal; and
a transistor comprising:
a first terminal coupled to the input terminal of the gain stage;
a second terminal coupled to the common terminal; and
a third terminal coupled to the output terminal of the logarithmic amplifier circuit.

18. The logarithmic amplifier circuit of claim 17, wherein the adaptive gain amplifier circuit further comprises:
a resistor comprising:
a first terminal coupled to the output terminal of the gain stage; and
a second terminal coupled to the third terminal of the transistor.

19. The logarithmic amplifier circuit of claim 17, wherein:
the transistor is a first transistor; and
the logarithmic amplifier circuit comprises:
a second transistor comprising:
a first terminal coupled to third terminal of the first transistor;
a second terminal coupled to the output terminal of the gain stage;
and
a third terminal coupled to a ground terminal.

20. The logarithmic amplifier circuit of claim 19, further comprising:
a resistor comprising:
a first terminal coupled to the third terminal of the first transistor; and
a second terminal coupled to the first terminal of the second transistor.

* * * * *